United States Patent [19]

Niggemann

[11] Patent Number: 4,975,803
[45] Date of Patent: Dec. 4, 1990

[54] COLD PLANE SYSTEM FOR COOLING ELECTRONIC CIRCUIT COMPONENTS

[75] Inventor: Richard E. Niggemann, Rockford, Ill.

[73] Assignee: Sundstrand Corporation, Rockford, Ill.

[21] Appl. No.: 280,951

[22] Filed: Dec. 7, 1988

[51] Int. Cl.⁵ .............................................. H05K 7/20
[52] U.S. Cl. .................................................... 361/385
[58] Field of Search ................. 361/385, 388, 389, 381

[56] References Cited

U.S. PATENT DOCUMENTS

| 4,315,300 | 2/1982 | Parmerlee et al. | 361/382 |
| 4,368,779 | 1/1983 | Rojey et al. | 165/165 |
| 4,494,171 | 1/1985 | Bland et al. | 361/386 |
| 4,624,305 | 11/1986 | Rojey | 165/165 |
| 4,712,158 | 12/1987 | Kikuchi et al. | 361/385 |

FOREIGN PATENT DOCUMENTS 657738  9/1986  Switzerland ......................... 361/385

Primary Examiner—Roy N. Envall, Jr.
Attorney, Agent, or Firm—Wood, Phillips, Mason, Recktenwald & Vansanten

[57] ABSTRACT

The problem is dissipating heat from electronic circuit components is solved by a cold plane system which includes a generally flat housing (10) having a closed interior cavity and a generally flat exterior surface (16a) on which the electronic circuit components (12) are mountable. A pool (32) of liquid coolant fills a portion of the closed interior cavity in thermal communication with the exterior surface. An edge (42) of the housing remote from the pool of liquid coolant is adapted for thermal coupling to a cold chassis (36) to define a condenser means. The liquid is caused to boil from heat generated by the electronic circuit components. The resulting vapor is condensed by the condenser means, and the liquid condensate flows back to the pool of liquid coolant in a reflux manner. The housing is defined by a sandwich of a plurality of stacked plates (16a, 16b, 18a, 18b), with inner plates (18a, 18b) defining a porous core structure for the interior cavity. Preferably, over half the interior cavity is filled with the liquid coolant so that the cold plane is omni-directional.

18 Claims, 4 Drawing Sheets

COLD PLANE SYSTEM FOR COOLING ELECTRONIC CIRCUIT COMPONENTS

FIELD OF THE INVENTION

This invention generally relates to a cooling system for electronic circuit components and, particularly, to such a cooling system including a cold plane or plate in which a coolant circulates in a reflux manner between liquid and vapor states.

BACKGROUND OF THE INVENTION

There is a constant demand for smaller electronic components and/or modules, particularly in the aircraft or aerospace fields, where size and weight are of critical importance. Microelectronics offers a great reduction in size and weight of electronic components where the components are mounted on boards including integrated circuitry.

One of the first steps in size and cost reduction was the modular concept where electronic plug-in modules were developed to meet various system requirements. Standard hardware designs were provided to have a plurality of modules which plug in a chassis to form an assembly. Normally, these plug-in modules slide in grooves in the chassis and engage a mating female electro-optical connector accessing the module to a mother board electro-optical back plane. These modules are closely assembled and dissipate considerable heat which, if not removed efficiently, greatly affects component reliability.

This problem of dissipating heat has been approached by various attempts to cool the electronic assemblies, ranging from some type of cooling fan assembly to cooling coils.

One approach for improving the cooling arrangement for an electronic plug-in module assembly is shown in U.S. Pat. No. 4,315,300 to Parmerlee et al, dated Feb. 9, 1982. This patent shows an arrangement where a plurality of modules are supported in grooves defined by a pair of parallel sides of a chassis. Each parallel side is provided with fluid passageways for carrying a cooling liquid for removing heat transferred from a heat sink on each module to the sides of the grooves. A plurality of apertures are provided in each side between adjacent grooves and carry fins through which cool air is blown to cool each side of each plug-in module. Such arrangements may be adequate, advanced some electronic components, but it simply is insufficient for advanced components, such as "supercomputers", advanced radar or other systems where 200-500 watts of heat are anticipated to be generated by each module.

Another approach to solving the problem of dissipating heat from electronic circuit components is shown in the cooling system of U.S. Pat. No. 4,712,158 to Kikuchi et al, dated Dec. 8, 1987. This patent discloses a cooling system for electronic circuit components mounted on a printed circuit board and includes a cooling plate having a coolant passage, with thermal contacts arranged on the cooling plate in contact with the surfaces of the electronic components. The components are cooled through the thermal contacts by liquid coolant flowing through the coolant passage. The coolant enters the cooling plate through an inlet and continuously flows through the plate and is discharged through an outlet. Such a system is extremely leak prone, particularly when one considers the number of modules that may be plugged into a chassis and the network of "plumbing" required to provide a circuit for the moving coolant.

This invention is directed to solving this problem of cooling electronic components by providing a cold plane with a self-contained cooling network of liquid coolant in a reflux, boiling and condensing, manner.

SUMMARY OF THE INVENTION

An object, therefore, of the invention is to provide a new and improved cold plane system for cooling electronic circuit components.

Generally, in the exemplary embodiment of the invention, the system includes means defining a generally flat housing having a closed interior cavity and a generally flat exterior surface on which the electronic circuit components are mountable. A pool of liquid coolant fills only a portion of the closed interior cavity, in thermal communication with the exterior surface. An edge of the housing remote from the pool of liquid coolant is adapted for thermal coupling to a cold chassis, such as a cooled grooved chassis, to define a condenser means. With this unique self-contained system, the liquid is caused to boil from heat generated by the electronic circuit components. The resulting vapor is condensed by the condenser means, and the liquid condensate flows back to the pool of liquid coolant in a reflux manner.

More particularly, the generally flat housing is formed by a sandwich of a plurality of stacked plates. The peripheral edges of the plates are continuous and at least the end-most plates of the stack are solid to close the interior of the housing, and at least some of the inner plates have openings to provide a porous core structure defining the interior cavity for the pool of liquid coolant. As an example, the inner plates may be formed with generally parallel, diagonal slots, with the plates being alternatively oriented such that the slots in adjacent plates are in intersecting directions. This defines the porous core structure of the housing which contains the pool of liquid coolant.

Preferably, the housing is generally rectangularly shaped to define four edges for thermally coupling the cold plane in appropriate edge-receiving grooves of a cold chassis and, thereby, providing for omni-directional mounting of the cold plane. To this end, over 50% of the interior cavity of the housing is filled with the liquid coolant such that a high power electronic circuit component properly positioned centrally of the housing, in relation to the interior cavity, will always be located below the liquid level regardless of the gravitational orientation of the housing.

Other objects, features and advantages of the invention will be apparent from the following detailed description taken in connection with the accompanying drawings.

BRIEF DESCRIPTION OF THE DRAWINGS

The features of this invention which are believed to be novel are set forth with particularity in the appended claims. The invention, together with its objects and the advantages thereof, may be best understood by reference to the following description taken in conjunction with the accompanying drawings, in which like reference numerals identify like elements in the figures and in which:

DETAILED DESCRIPTION OF THE PREFERRED EMBODIMENT

Figure 1:
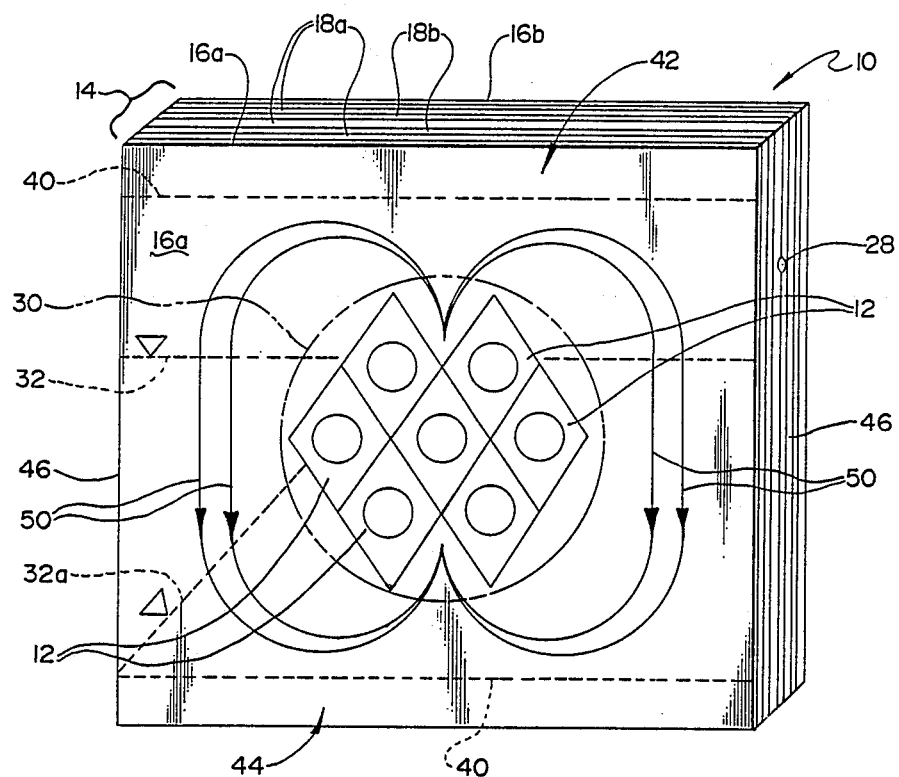
FIG. 1 is a perspective view of a cold plane according to the invention, illustrating somewhat schematically the location of the electronic circuit components, the coolant liquid level, the location of the chassis condensers and the general direction of the two-phase flow pattern.

Referring to the drawings in greater detail, and first to FIG. 1, the system of this invention contemplates a cold plane system which includes a cold plate, generally designated 10, for cooling electronic circuit components 12, mounted to a flat face of the cold plate. As will be described in greater detail hereinafter, the cold plate defines a generally flat housing having a closed interior cavity. A pool of liquid coolant fills a portion of the cavity and is caused to boil from heat generated by circuit components 12, the resulting vapor being condensed, and the liquid condensate flowing back to the pool of liquid coolant in a reflux manner.

More particularly, as seen in FIG. 1, the generally flat housing defined by cold plate 10 is formed by a sandwich of a plurality of stacked plates, to define a finite thickness, as at 14. Although variable, depending upon the number of plates, the thickness of the cold plate defined by the stacked plates may be on the order of 3/16-$\frac{1}{8}$ inch thick and comprise 7-10 sheet-like plates of conductive material, such as metal. The end-most plates 16a and 16b of the stack are solid, and at least one end plate, such as plate 16a, defines a flat exterior surface on which electronic circuit components 12 are mountable. It should be understood that the mounting means for the electronic circuit components, including any integrated circuitry, are not shown and may vary in conventional manner.

Figure 2:
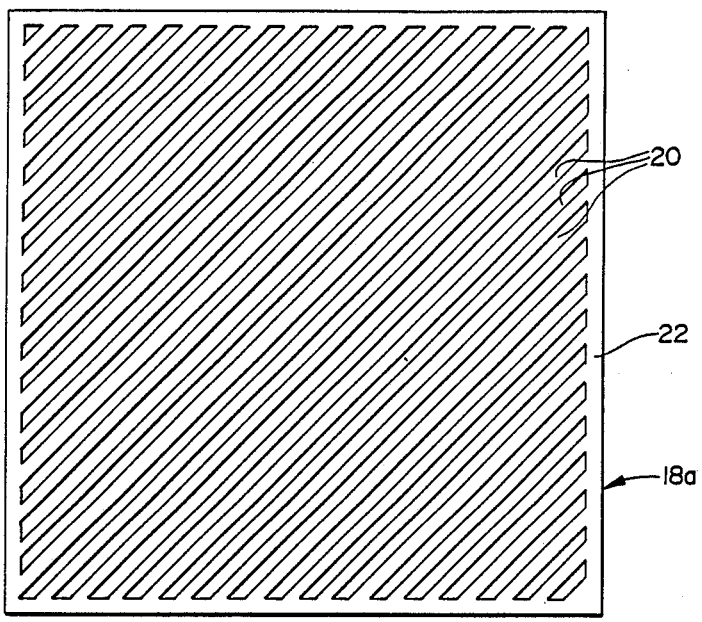
FIG. 2 is a plan view of one of the inner plates of the housing defining the porous core structure.
Figure 3:
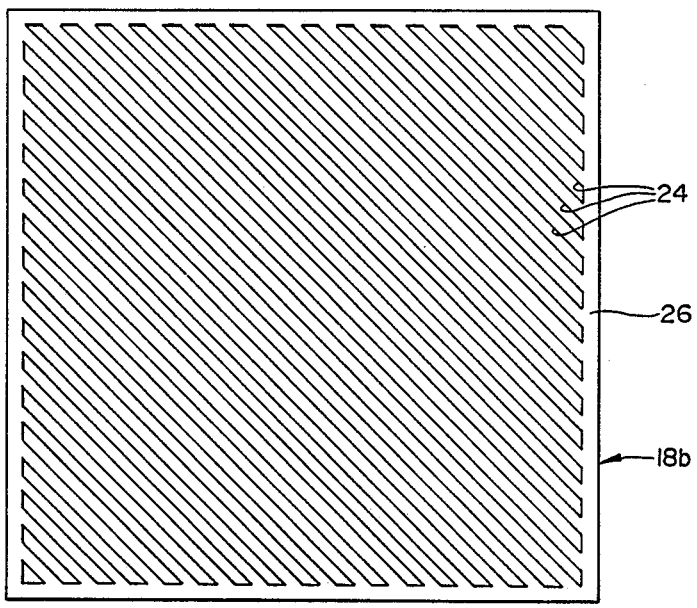
FIG. 3 is a view similar to that of FIG. 2, but of one of the inner plates which would be located adjacent to the plate of FIG. 2.

Referring to FIGS. 2 and 3 in conjunction with FIG. 1, inner plates 18a (FIG. 2) and 18b (FIG. 3) are sandwiched between end plates 16a and 16b in an alternating fashion as shown at the top of FIG. 1. These plates 18a, 18b provide a porous core structure for the generally flat housing defining cold plate 10. Specifically, plate 18a (FIG. 2) has a plurality of generally parallel lands 20 extending between a continuous peripheral edge portion 22 of the plate. Likewise, plate 18b (FIG. 3) has a plurality of parallel lands 24 extending between a continuous peripheral edge portion 26 of the plate. By alternating plates 18a and 18b, with their lands 20 and 24, respectively, oriented as shown in the drawings, it can be seen that the slots and lands of adjacent plates run in intersecting directions. This provides the porous core structure for the cold plate. In other words, the intersecting slots define cross openings and lateral channels for movement therethrough of either liquid or vapor and provide very excellent thermal communication between the liquid and the increased surfaced areas provided by the lands of the cavernous passages within the structure of the cold plate.

In assembling cold plate 10, alternating inner plates 18a,18b are sandwiched between end plates 16a and 16b and a closed housing is formed by brazing the plates together. Since end plates 16a and 16b are solid, and the peripheral edge portions 22 and 26 of inner plates 18a and 18b, respectively, are continuous, it can be understood that an interior cavity is formed by the porous core structure provided by the slotted configurations of plates 18a and 18b.

With the above description of the housing means defining cold plate 10, it also can be understood that the completely closed interior cavity of the housing can be filled with a pool of liquid coolant. To this end, a fill port 28 (FIG. 1) may be bored into one edge of the stack of plates to admit liquid coolant into the closed interior cavity of the cold plate. When filled to the desired level, fill port 28 is sealed shut.

FIG. 1 shows a number of electronic circuit components 12 generally centrally located in a cluster on the face of plate 16a. This particular configuration or cluster is exemplary, but it illustrates the desirability of locating "high heat" components at a central location of the cold plate. A dashed circle 30 is shown to approximate a high heat region generated by the heat from the electronic components. A dashed line 32 represents the level of liquid coolant in the pool of coolant filling the interior cavity of cold plate 10. It can be seen that the liquid level indicates that the pool of liquid coolant fills over 50% of the interior cavity. This is preferred so that the liquid level covers a substantial portion of heated area 30 but leaves a vapor region above the level of the liquid. In addition, it can be seen by dashed line 32a that the cold plane is made omni-directional. In other words, should the cold plate be tilted such that liquid level 32a is horizontal, it can be seen that the liquid still covers the same area of heated region 30 regardless of the gravitational orientation of the housing in a vertical plane. With suitable selection of refluxing coolant, the cold plane will operate properly even when it is in a horizontal plane. In that orientation the liquid will fill the lower portions of the porous structure which is thermally well connected by the intersections of the lands 20 and 24 to the heat liberating devices 12. Likewise, the portions of the cold plane not covered by liquid in the condenser zones 40 and 42 will act as condensing surfaces.

Figure 4:
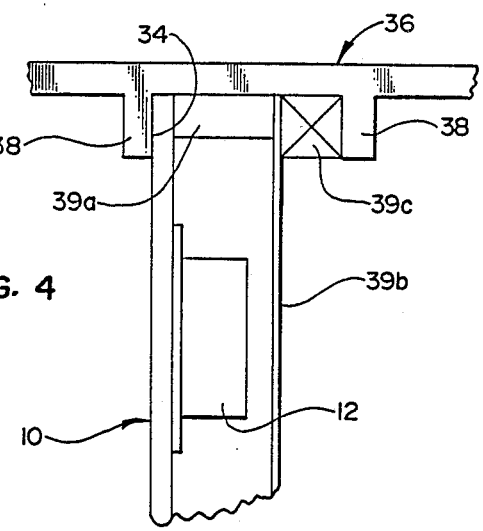
FIG. 4 is a somewhat schematic illustration of an edge of the cold plane coupled to a cold chassis.

FIG. 4 shows somewhat schematically how cold plate 10 is mounted within a groove 34 of a cold chassis, generally designated 36. The chassis includes side cold ribs 38 defining groove 34 within which an edge of cold plate 10 is coupled or "plugged-in". A spacer 39a, a dust cover 39b and a wedge clamp 39c also might be used. This grooved configuration defined by cold ribs 38 of cold chassis 36 is shown by dashed lines 40 at the top of cold plate 10 in FIG. 1. In essence, by edge mounting cold plate 10 in cold chassis 36, upper and lower condenser areas, generally designated 42 and 44, respectively, are defined. Of course, with the orientation of cold plate 10 as illustrated in FIG. 1, upper condenser 42 actually would be effective to cause condensation, as described hereinafter, while lower condenser 44 would be effective to cool the pool of coolant within the cold plate at the bottom of the pool. It also should be understood that since cold plate 10 is designed as an omnidirectional system, either side edge 46 of the cold plate likewise is adapted for thermal coupling within grooves of an appropriate cold chassis.

Details of cold chassis 36 are not described herein but can be derived from my copending application Ser. No. 293,129, filed Jan. 3, 1989, now U.S. Pat. No. 4,962,444. That copending application is incorporated herein by reference.

In operation, and again referring to FIG. 1, keeping in mind that cold plate 10 is thermally coupled within a cold chassis as illustrated in FIG. 4, it can be understood that considerable heat is generated by electronic circuit components 12. With modern "supercomputers", power supplies, radar systems or the like, it is anticipated that 200-500 may be generated per module. This heat is concentrated centrally of the cold plate, approximately in a region as shown by circle 30. This heat causes the liquid coolant in the interior pool defined by liquid level 32 to boil. When this vaporization occurs, the vapor will rise and come into contact with the upper condenser area 42 where the cold plate is thermally coupled to cold chassis 36 (FIG. 4). The vapor will condense in the colder condenser region and the liquid condensate will fall back into the pool of liquid coolant within the cold plate. The porous core structure provided by slotted inner plates 18a and 18b allows the liquid to cascade among the openings and channels of the structure providing excellent thermal communication between the condensate and the increased surface areas of the cavernous passages within the structure of the cold plane, i.e. the interior cavity defined by intersecting lands 20 and 24 of alternating inner plates 18a and 18b, respectively. This two-phase flow pattern is shown generally by extended arrowed lines 50 in FIG. 1 which diagrammatically illustrates the reflux-type system of cold plate 10. In other words, a completely self-contained cold plane system is provided for cooling the electronic circuit components, without requiring any coolant circuitry or other extraneous plumbing outside the confines of the cold plate itself.

It is possible to provide through holes from end plate 16a to end plate 16b for bolting components or for electrical feed-throughs, with components mounted on both the front and the back of the cold plane. The holes would go through the intersections of lands 20 and 24 to preclude leakage.

Figure 5:
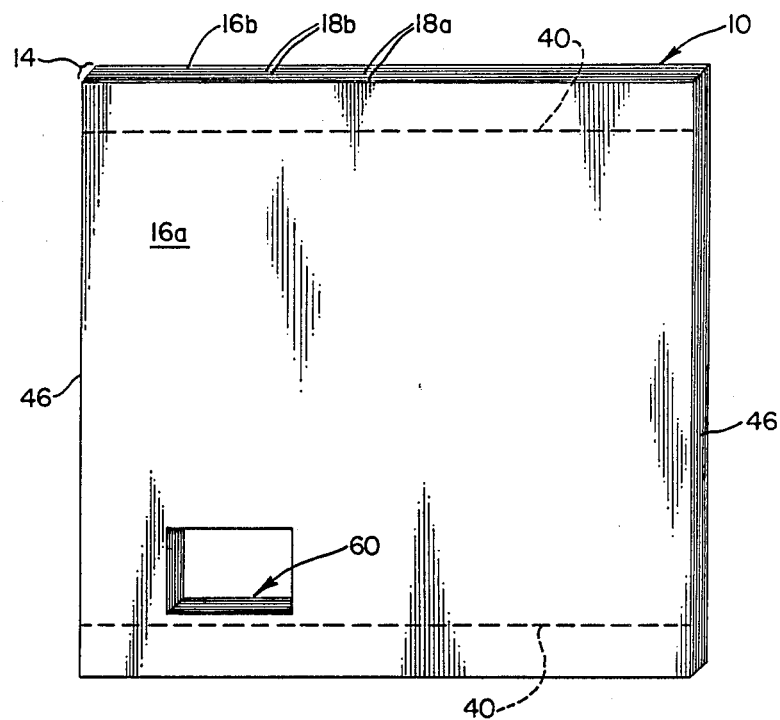
FIG. 5 is a view somewhat similar to that of FIG. 1, but to show a modification.
Figure 6:
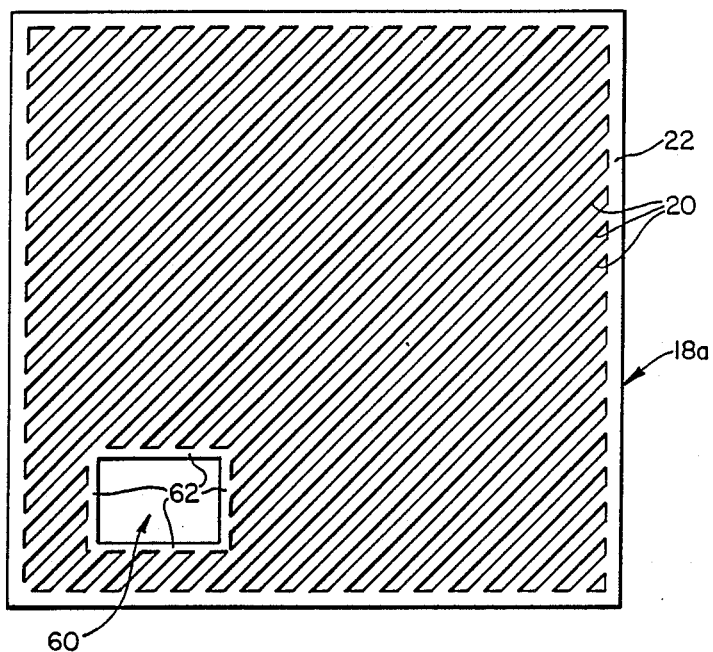
FIG. 6 is a view of one of the inner plates for the structure of FIG. 5.
Figure 7:
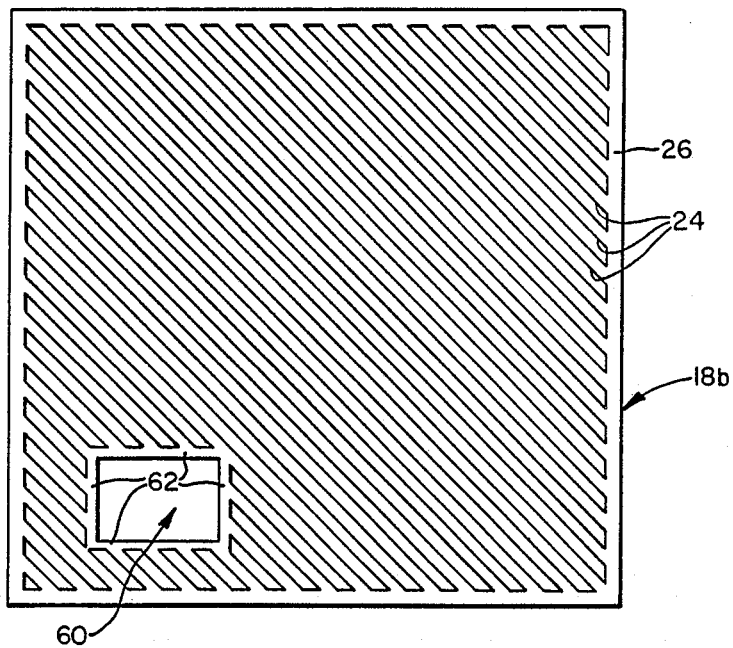
FIG. 7 is a view of an adjacent inner plate relative to FIG. 6.

In addition, and referring to FIGS. 5-7, relatively large areas of the cold plane may be open entirely therethrough to allow placement and packaging of bulky low power components, such as transformers. More particularly, like numerals have been applied to cold plane 10 in FIG. 5 as well as inner plates 18a and 18b in FIGS. 6 and 7, respectively, corresponding to the above description of FIGS. 1-4. Such a large open area for placing a bulky low power component is generally designated 60. Of course, inner plates 18a and 18b would have closed boundries 62 around the open area to seal the area.

It will be understood that the invention may be embodied in other specific forms without departing from the spirit or central characteristics thereof. The present examples and embodiments, therefore, are to be considered in all respects as illustrative and not restrictive, and the invention is not to be limited to the details given herein.

I claim:

1. A cold plane system for cooling electronic circuit components, comprising:
   means defining a generally flat housing having a closed interior cavity and a generally flat exterior surface on which the electronic circuit components are mountable, said interior cavity being defined by a porous core structure formed by a sandwich of plates having overlapping openings to provide a path for riser vapor and a cascade means for falling liquid condensate;
   a pool of liquid coolant filling a portion of the closed interior cavity in thermal communication with the exterior surface; and
   an edge of the housing remote from the pool of liquid coolant being adapted for thermal coupling to a cold chassis to define a condenser means whereby the liquid is caused to boil from heat generated by the electronic circuit components, the resulting vapor being condensed by the condenser means, and the liquid condensate flowing back to the pool of liquid coolant in a reflux manner.

2. The cold plane system of claim 1 wherein over 50% of the interior cavity of the housing is filled with the liquid coolant such that at least a portion of an electronic circuit component properly positioned centrally of the housing, in relation to the interior cavity, will always be located below the liquid level regardless of the gravitational orientation of the housing.

3. The cold plane system of claim 1 wherein each of said plates is formed with generally parallel, diagonal lands, the plates being alternatively oriented such that the lands in adjacent plates are in intersecting directions.

4. The cold plane system of claim 1 wherein said housing is generally rectangularly shaped to define four edges for thermal coupling in appropriate edge-receiving grooves of a cold chassis.

5. The cold plane system of claim 1, in combination with a cold chassis having a groove for receiving said edge of the housing.

6. A cold plane system for cooling electronic circuit components, comprising:
   means defining a generally flat housing having a closed interior cavity and a generally flat exterior surface on which the electronic circuit components are mountable, said housing comprising a sandwich of a plurality of stacked plates, the peripheral edges of the plates being continuous and at least the endmost plates of the stack being substantially solid to close the interior of the housing, and at least some of the inner plates having openings to provide a porous core structure defining said interior cavity;
   a pool of liquid coolant filling a portion of the closed interior cavity in thermal communication with the exterior surface; and
   an edge of the housing remote from the pool of liquid coolant being adapted for thermal coupling to a cold chassis to define a condenser means whereby the liquid is caused to boil from heat generated by the electronic circuit components, the resulting vapor being condensed by the condenser means, and the liquid condensate flowing back to the pool of liquid coolant in a reflux manner.--

7. The cold plane system of claim 6 wherein each of said inner plates is formed with generally parallel, diagonal lands, the plates being alternatively oriented such that the lands in adjacent plates are in intersecting directions.

8. The cold plane system of claim 1, including a sealed through hole transversely through the housing for mounting a bulky low power component and the like.

9. A cold plane system for cooling electronic circuit components, comprising:
 means defining a generally flat housing having a closed interior cavity and a generally flat exterior surface on which the electronic circuit components are mountable, the internal cavity of the housing being defined by a porous core structure formed by a sandwich of plates having overlapping openings providing a path for rising vapor and a cascade means for falling liquid condensate;
 a pool of liquid coolant filling over 50% of the closed interior cavity in thermal communication with the exterior surface such that at least a portion of an electronic circuit component properly positioned centrally of the exterior surface, in relation to the interior cavity, will always be located thermally close to the liquid level regardless of the gravitational orientation of the housing; and
 at least an upper edge of the housing remote from the pool of liquid coolant being adapted for thermal coupling to a cold chassis to define a condenser means whereby the liquid is caused to boil from heat generated by the electronic circuit components, the resulting vapor rising in the path defined by the porous core structure and being condensed by the condenser means, and the liquid condensate cascading over the porous core structure back to the pool of liquid coolant in a reflux manner.

10. The cold plane system of claim 9 wherein each of said plates is formed with generally parallel, diagonal lands, the plates being alternatively oriented such that the lands in adjacent plates are in intersecting directions.

11. The cold plane system of claim 9 wherein said housing is generally rectangularly shaped to define four edges for thermally coupling in appropriate edgereceiving grooves of a cold chassis.

12. The cold plane system of claim 9, in combination with a cold chassis having a groove for receiving said edge of the housing.

13. A cold plane system for cooling electronic circuit components, comprising:
 means defining a generally flat housing having a closed interior cavity and a generally flat exterior surface on which the electronic circuit components are mountable, the internal cavity of the housing being defined by a porous core structure providing a path for rising vapor and a cascade means for falling liquid condensate, said housing comprising a sandwich of a plurality of stacked plates, the peripheral edges of the plates being continuous and at least the end-most plates of the stack being substantially solid to close the interior of the housing, and at least some of the inner plates having openings to provide a porous core structure defining said interior cavity;
 a pool of liquid coolant filling over 50% of the closed interior cavity in thermal communication with the exterior surface such that at least a portion of an electronic circuit component properly positioned centrally of the exterior surface, in relation to the interior cavity, will always be located thermally close to the liquid level regardless of the gravitational orientation of the housing: and
 at least an upper edge of the housing remote from the pool of liquid coolant being adapted for thermal coupling to a cold chassis to define a condenser means whereby the liquid is caused to boil from heat generated by the electronic circuit components, the resulting vapor rising in the path defined by the porous core structure and being condensed by the condenser means, and the liquid condensate cascading over the porous core structure back to the pool of liquid coolant in a reflux manner.

14. The cold plane system of claim 13 wherein each of said inner plates is formed with generally parallel, diagonal lands, the plates being alternatively oriented such that the lands in adjacent plates are in intersecting directions.

15. A cold plane system for cooling electronic circuit components, comprising:
 means defining a housing having a closed interior cavity and an exterior surface on which the electronic components are mountable, the interior cavity being defined by a porous core structure formed by a sandwich of plates having overlapping openings;
 a pool of liquid coolant filling a portion of the closed interior cavity in thermal communication with the exterior surface; and
 a portion of the housing remote from the pool of liquid coolant being adapted for thermal coupling to a cold chassis to define condenser means whereby the liquid is caused to boil from heat generated by the electronic circuit components, the resulting vapor being condensed by the condenser means, and the liquid condensate flowing back to the pool of liquid coolant in a reflux manner.

16. The cold plane system of claim 15 wherein over 50% of the interior cavity of the housing is filled with the liquid coolant such that at least a portion of an electronic circuit component properly positioned centrally of the housing, in relation to the interior cavity, will always be located thermally close to the liquid level regardless of the gravitational orientation of the housing.

17. The cold plane system of claim 15 wherein each of said plates is formed with generally parallel, diagonal lands, the plates being alternatively oriented such that the lands in adjacent plates are in intersecting directions.

18. The cold plane system of claim 15, in combination with a cold chassis for receiving said portion of the housing thermally coupled to the cold chassis.

* * * * *